(12) United States Patent
Li et al.

(10) Patent No.: US 11,329,108 B2
(45) Date of Patent: May 10, 2022

(54) DISPLAY DEVICE AND MANUFACTURING METHOD THEREOF

(71) Applicant: Au Optronics Corporation, Hsinchu (TW)

(72) Inventors: Wen-Yuan Li, Hsinchu (TW); Tai-Hsiang Huang, Hsinchu (TW); Pin-Hsiang Chiu, Hsinchu (TW); Zheng-Han Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 218 days.

(21) Appl. No.: 16/843,906

(22) Filed: Apr. 9, 2020

(65) Prior Publication Data
US 2021/0151525 A1    May 20, 2021

(30) Foreign Application Priority Data
Nov. 18, 2019   (TW) .................................. 108141816

(51) Int. Cl.
*G06K 9/00* (2022.01)
*H01L 27/32* (2006.01)
(Continued)

(52) U.S. Cl.
CPC ........ *H01L 27/3234* (2013.01); *B06B 1/0292* (2013.01); *G02F 1/1368* (2013.01);
(Continued)

(58) Field of Classification Search
CPC ............... H01L 27/3234; H01L 27/322; H01L 27/3258; H01L 27/3276; H01L 51/5284;
(Continued)

(56) References Cited

U.S. PATENT DOCUMENTS 9,815,087 B2   11/2017   Ganti et al.
9,939,942 B2   4/2018   Kuo et al.
(Continued)

FOREIGN PATENT DOCUMENTS

| CN | 105980968 | 9/2016 |
|---|---|---|
| CN | 107886040 | 4/2018 |

(Continued)

*Primary Examiner* — Abdul-Samad A Adediran
(74) *Attorney, Agent, or Firm* — JCIPRNET

(57) ABSTRACT

A display device and a manufacturing method thereof are provided. The display device includes a first substrate, a second substrate, first signal lines, second signal lines, a first insulation layer, active components, a display medium, and ultrasonic transducers. The first insulation layer is located between the first signal lines and the second signal lines. Cavities are located in the first insulation layer having thin films located on the cavities. Each of the ultrasonic transducers includes first and second electrodes. A first electrode and a corresponding first signal line belong to a same layer and are electrically connected with each other. A second electrode and a corresponding second signal line belong to a same layer and are electrically connected with each other. A corresponding cavity and a corresponding thin film are sandwiched between the first and second electrodes.

14 Claims, 19 Drawing Sheets

(51) Int. Cl.
| | |
|---|---|
| *B06B 1/02* | (2006.01) |
| *G02F 1/1333* | (2006.01) |
| *G02F 1/1335* | (2006.01) |
| *G02F 1/1339* | (2006.01) |
| *G02F 1/1362* | (2006.01) |
| *G02F 1/1368* | (2006.01) |
| *H01L 51/52* | (2006.01) |
| *H01L 51/56* | (2006.01) |
| *G06V 40/13* | (2022.01) |
| *G06V 40/10* | (2022.01) |
| *G02F 1/1341* | (2006.01) |

(52) U.S. Cl.
CPC ...... *G02F 1/13338* (2013.01); *G02F 1/13394* (2013.01); *G02F 1/133345* (2013.01); *G02F 1/133512* (2013.01); *G02F 1/136286* (2013.01); *G06V 40/10* (2022.01); *G06V 40/1306* (2022.01); *H01L 27/322* (2013.01); *H01L 27/3258* (2013.01); *H01L 27/3276* (2013.01); *H01L 51/5284* (2013.01); *H01L 51/56* (2013.01); *G02F 1/1341* (2013.01); *G02F 1/136295* (2021.01); *H01L 2227/323* (2013.01)

(58) Field of Classification Search
CPC .............. H01L 51/56; H01L 2227/323; G06V 40/1306; B06B 1/0292; G02F 1/133345; G02F 1/13338; G02F 1/133512; G02F 1/13394; G02F 1/136286; G02F 1/1368; G02F 1/136295; G02F 1/1341; G01S 1/72; G06F 3/0412

See application file for complete search history.

(56) References Cited

U.S. PATENT DOCUMENTS

| | | | |
|---|---|---|---|
| 10,478,858 | B2 | 11/2019 | Lasiter et al. |
| 2015/0165479 | A1 | 6/2015 | Lasiter et al. |
| 2015/0169136 | A1 | 6/2015 | Ganti et al. |
| 2017/0123538 | A1 | 5/2017 | Kuo et al. |
| 2018/0096660 | A1 | 4/2018 | Liu et al. |
| 2019/0251378 | A1* | 8/2019 | Jung .................. G01S 1/72 |
| 2021/0109636 | A1* | 4/2021 | Lius .................. G06F 3/0412 |

FOREIGN PATENT DOCUMENTS

| | | |
|---|---|---|
| CN | 108871389 | 11/2018 |
| CN | 110008929 | 7/2019 |
| TW | 201716940 | 5/2017 |

\* cited by examiner

DISPLAY DEVICE AND MANUFACTURING METHOD THEREOF

CROSS-REFERENCE TO RELATED APPLICATION

This application claims the priority benefit of Taiwan application serial no. 108141816, filed on Nov. 18, 2019. The entirety of the above-mentioned patent application is hereby incorporated by reference herein and made a part of this specification.

BACKGROUND OF THE INVENTION

Field of the Invention

The invention relates to a display device, and more particularly, to a display device including ultrasonic transducers and a manufacturing method thereof.

Description of Related Art

At present, a fingerprint recognition device is often used in a personal electronic product. For example, an electronic product such as a mobile phone and a tablet computer are equipped with a fingerprint recognition device to ensure that users' personal privacy is not readily leaked.

In the prior art, a capacitive touch sensing device or an optical fingerprint recognition sensing device is often incorporated into a display device with display function such as a mobile phone and a tablet computer. However, the capacitive touch sensing device affects the transmittance of the display device, and the optical fingerprint recognition sensor device affects the aperture ratio of the display device, so that the display quality of the display device is reduced.

SUMMARY OF THE INVENTION

The invention provides a display device that may reduce the influence on the thickness of the display device by ultrasonic transducers.

The invention provides a manufacturing method of a display device that may reduce the influence on the thickness of the display device by ultrasonic transducers.

An embodiment of the invention provides a display device. The display device includes a first substrate, a second substrate, a plurality of first signal lines, a plurality of second signal lines, a first insulation layer, a plurality of active components, a display medium, and a plurality of ultrasonic transducers. The first signal lines and the second signal lines are located on the first substrate. The first insulation layer is located between the first signal lines and the second signal lines. A plurality of cavities are located in the first insulation layer. The first insulation layer has a plurality of thin films located on the cavities. The active components are electrically connected to the first signal lines and the second signal lines. The display medium layer is located between the first substrate and the second substrate. The ultrasonic transducers are located between the first substrate and the second substrate, wherein each of the ultrasonic transducers includes a first electrode and a second electrode. The first electrode and a corresponding first signal line belong to a same layer and are electrically connected with each other. The second electrode and a corresponding second signal line belong to a same layer and are electrically connected with each other. A corresponding cavity and a corresponding thin film are sandwiched between the first electrode and the second electrode.

An embodiment of the invention provides a manufacturing method of a display device including the following steps. A first substrate is provided. A first conductive layer is formed on the first substrate, wherein the first conductive layer includes a plurality of first signal lines and a plurality of first electrodes connected to the first signal lines. A plurality of sacrificial material layers are formed on the first electrodes. A first insulation material layer is formed to cover the first signal lines, the first electrodes, and the sacrificial material layers. A second conductive layer is formed on the first insulation material layer, wherein the second conductive layer includes a plurality of second signal lines and a plurality of second electrodes connected to the second signal lines. The first insulation material layer is patterned to form a first insulation layer including a plurality of openings, wherein the openings expose the sacrificial material layers, and the first insulation layer has a plurality of thin films located on the sacrificial material layers. The sacrificial material layers are removed to form a plurality of cavities in the first insulation layer, wherein the cavities and the thin films are sandwiched between the first electrodes and the second electrodes. A passivation layer is formed on the second conductive layer and the first insulation layer. A display medium layer is formed on the passivation layer. A second substrate is covered on the display medium.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
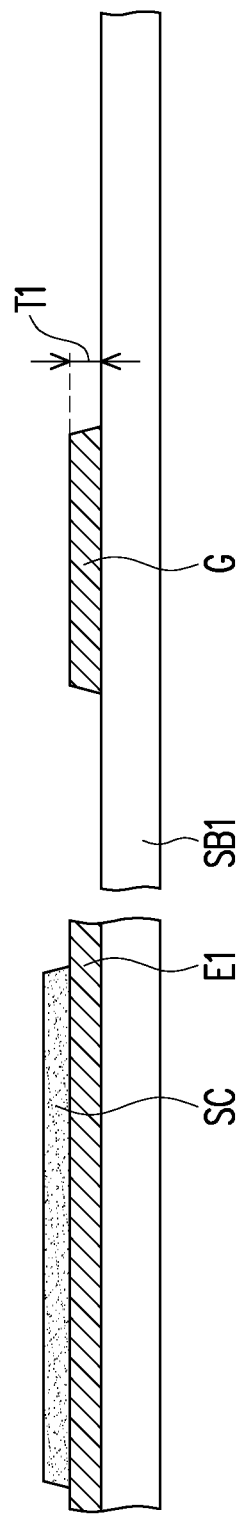
FIG. 1A to FIG. 1I are cross-sectional views of a manufacturing method of a display device according to an embodiment of the invention.

In the following, a plurality of of embodiments of the invention are disclosed with reference to figures, and for clarity, many practical details are also provided. However, it should be understood that, the practical details should not be used to limit the invention. In other words, in some embodiments of the invention, these practical details are not necessary. Moreover, to simplify the figures, some known structures and components are omitted or shown in a simple schematic manner in the figures.

In the entire specification, the same reference numerals represent the same or similar components. In the figures, for clarity, the thicknesses of, for instance, layers, films, panels, and regions are enlarged. It should be understood that, when a layer, film, region, or an component of a substrate is "on" another component or "connected to" another component, the component may be directly on the other component or connected to the other component, or other components may be present between the component and the other component. In contrast, when a component is referred to as being "directly on" or "directly connected to" another component, there are no other components in between the component and the other component. As used in the present specification, "connected to" may refer to a physical and/or electrical connection. Furthermore, two components that are "electrically connected" or "coupled" may mean that other components are present between the two components.

It should be understood that, even though terms such as "first", "second", etc., in the specification may be used herein to describe various components, members, regions, layers, and/or parts, these components, members, regions, and/or parts should not be limited by these terms. These terms are only used to distinguish one component, member, region, layer, or part from another component, member, region, layer, or part.

The terminology used in the specification is for the purpose of describing particular embodiments of the invention and is not intended to limit the invention. For example, the use of "a," "an," and "the" in the specification is not a limitation of the singular or plural form of the component. As used in the specification, "or" means "and/or". As used in the specification, the term "and/or" includes any and all combinations of one or a plurality of the associated listed items. It should also be understood that when used in the specification, the term "including" or "containing" specifies the stated features, regions, wholes, steps, operations, presence of components and/or components, but does not exclude the presence or addition of one or a plurality of other features, regions, wholes, steps, operations, components, parts, and/or a combination thereof.

In addition, relative terms such as "lower" or "bottom" and "upper" or "top" may be used herein to describe the relationship of one component to another component as shown in the figure. It should be understood that relative terms are intended to encompass different orientations of the device in addition to the orientation shown. For example, if the device in one figure is turned over, other components originally described as being on the "lower" side of the components are oriented to being on the "upper" side of the component. Thus, depending on the particular orientation of the drawings, the exemplary term "lower" may include orientations of "lower" and "upper". Similarly, if the device in one figure is turned over, other components described as originally "under" or "below" the component are oriented "above" the other components. Thus, the exemplary term "under" or "below" may encompass the orientations of above and below.

"About" or "substantially" used in the specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about" or "substantially" used in the specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

FIG. 1A to FIG. 1I are cross-sectional views of a manufacturing method of a display device according to an embodiment of the invention. FIG. 2 is a top view of the display device of FIG. 1I. FIG. 1A to FIG. 1I correspond to positions of lines aa' and bb' in FIG. 2, for example.

Figure 2:
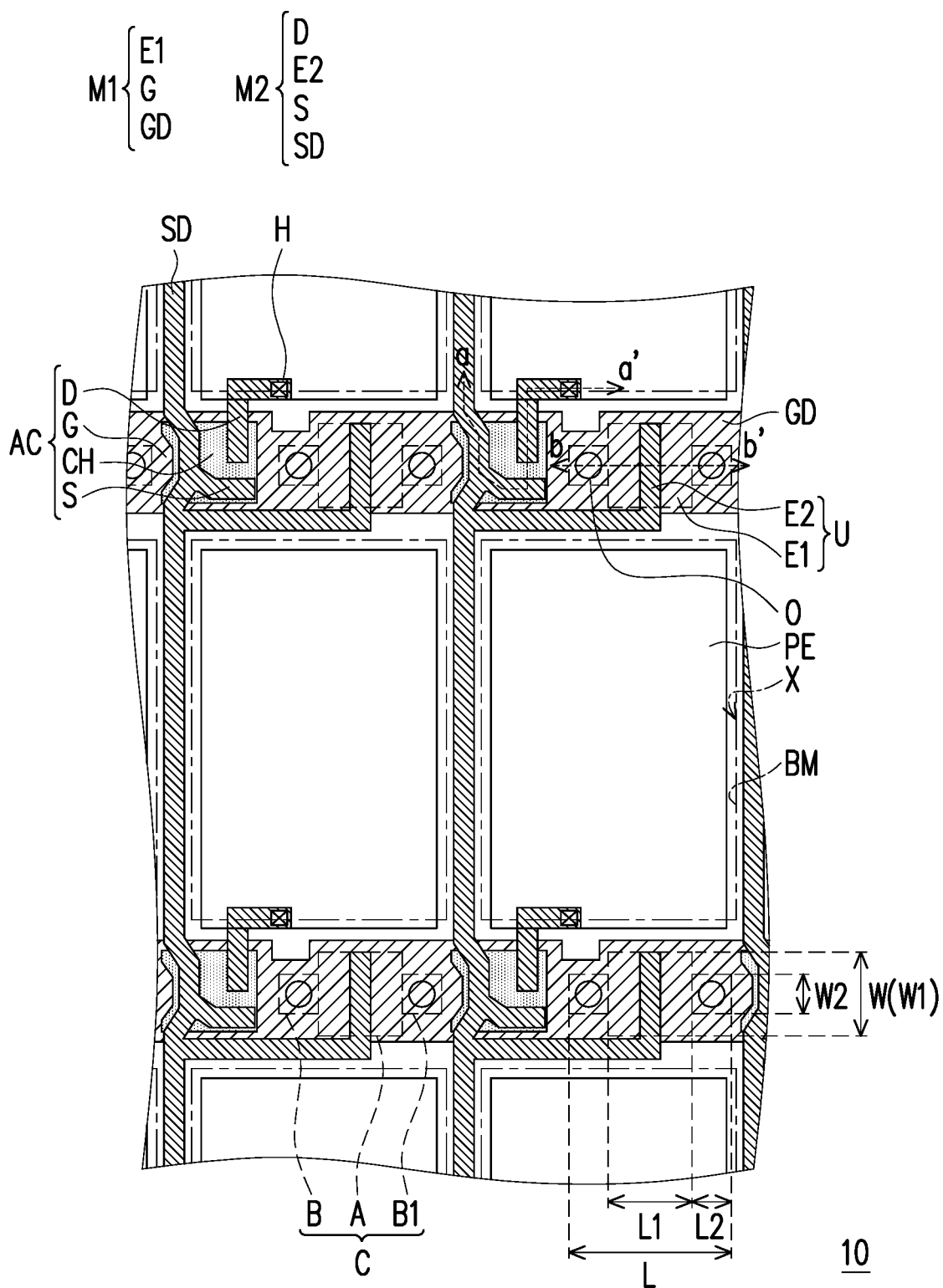
FIG. 2 is a top view of the display device of FIG. 1I.

Referring to FIG. 1A, a first substrate SB1 is provided. The material of the first substrate SB1 may be glass, quartz, an organic polymer, or an opaque/reflective material (such as a conductive material, a metal, a wafer, a ceramic, or other applicable materials), or other applicable materials. If a conductive material or a metal is used, then an insulation layer (not shown) is covered on the first substrate SB1 to avoid a short circuit issue.

A first conductive layer M1 is formed on the first substrate SB1. The first conductive layer M1 includes a plurality of first signal lines GD (shown in FIG. 2) and a plurality of first electrodes E1 connected to the first signal lines GD. In the present embodiment, the first conductive layer M1 further includes a plurality of gates G electrically connected to the first signal lines GD (shown in FIG. 2), and the first electrodes E1, the gates G, and the first signal lines GD belong to the same layer. In the present embodiment, the first electrodes E1 are electrically connected to the corresponding gates G and the corresponding first signal lines GD.

The first conductive layer M1 may be a single-layer or multi-layer structure, and the material thereof includes, for example, a metal such as chromium, gold, silver, copper, tin, lead, hafnium, tungsten, molybdenum, neodymium, titanium, tantalum, aluminum, zinc, and the like, an alloy thereof, a metal oxide thereof, a metal nitride thereof, or a combination thereof or other conductive materials.

A thickness T1 of the first conductive layer M1 is, for example, between 1000 angstroms and 8000 angstroms.

A plurality of sacrificial material layers SC are formed on the first electrodes E1. In the present embodiment, an area where the sacrificial material layers SC are vertically projected on the first substrate SB1 is smaller than an area where the first electrodes E1 are vertically projected on the first substrate SB1. In other words, in the present embodiment, the entire bottom surface of the sacrificial material layers SC is in contact with the first electrodes E1.

The material of the sacrificial material layers SC includes, for example, a metal material (such as copper, nickel, aluminum, molybdenum, chromium, or a combination of the materials), silicon oxide, metal oxide (such as indium tin oxide, indium zinc oxide, or a combination thereof), an organic material (such as a photoresist), or other suitable materials.

Figure 1B:
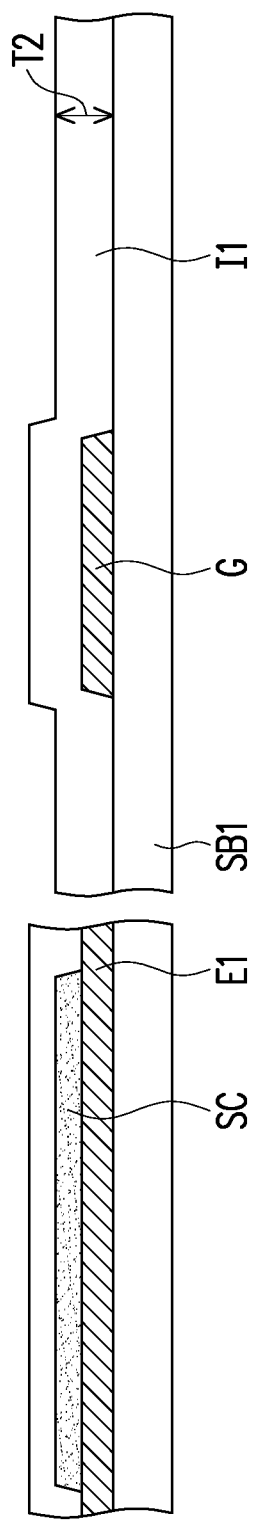

Referring to FIG. 1B, a first insulation material layer I1 is formed to cover the first conductive layer M1. In the present embodiment, the first insulation material layer I1 covers the first electrodes E1, the gates G, the first signal lines GD, and the sacrificial material layers SC.

The material of the first insulation material layer I1 includes, for example, silicon nitride ($SiN_x$, $Si_3N_4$), silicon oxide (SiOx), aluminum nitride (AlN), aluminum oxide ($Al_2O_3$), hafnium oxide ($HfO_2$), a photoresist, or other suitable materials.

A thickness T2 of the first insulation material layer I1 is, for example, between 1000 angstroms and 8000 angstroms.

Figure 1C:
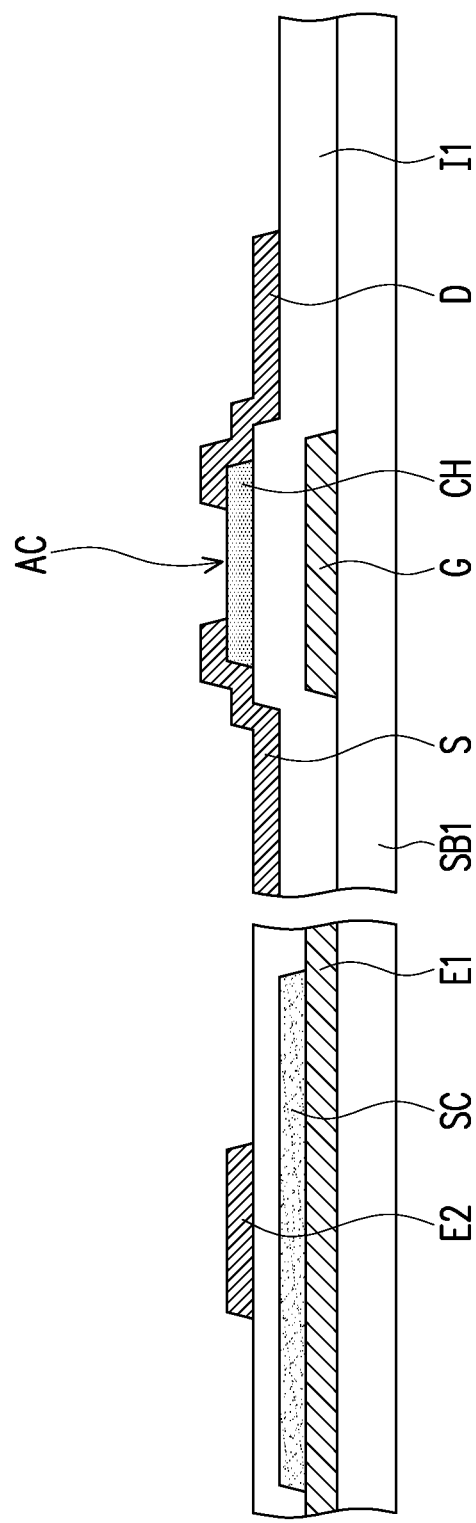

Referring to FIG. 1C, channel layers CH overlapped with the gates G are formed, wherein at least a portion of the first insulation material layer I1 is located between the gates G and the channel layers CH.

The channel layer CH is a single-layer or a multi-layer structure and contains amorphous silicon, polysilicon, microcrystalline silicon, monocrystalline silicon, an organic semiconductor material, an oxide semiconductor material (such as indium zinc oxide, indium gallium zinc oxide, or other suitable materials or a combination thereof), other suitable materials, or a dopant is included in the materials, or a combination thereof.

A second conductive layer M2 is formed on the first insulation material layer I1. The second conductive layer M2 includes a plurality of second signal lines SD (shown in FIG. 2) and a plurality of second electrodes E2 connected to the second signal lines SD. In the present embodiment, the second conductive layer M2 further includes a plurality of sources S and a plurality of drains D electrically connected to the channel layers CH, wherein the sources S are electrically connected to the second signal lines SD. In the present embodiment, the second electrodes E2, the sources S, the drains D, and the second signal lines SD belong to the same layer. In the present embodiment, the second electrodes E2 are electrically connected to the corresponding sources S and the corresponding second signal lines SD.

In the present embodiment, a portion of the first insulation material layer I1 is located between the first signal lines GD and the second signal lines SD.

The second conductive layer M2 may be a single-layer or multi-layer structure, and the material thereof includes, for example, a metal such as chromium, gold, silver, copper, tin, lead, hafnium, tungsten, molybdenum, neodymium, titanium, tantalum, aluminum, zinc, and the like, an alloy thereof, an oxide of the metals, a nitride of the metals, or a combination of the materials or other conductive materials.

At this point, active components AC are substantially complete. The active components AC are electrically connected to the first signal lines GD (shown in FIG. 2) and the second signal lines SD (shown in FIG. 2).

Figure 1D:
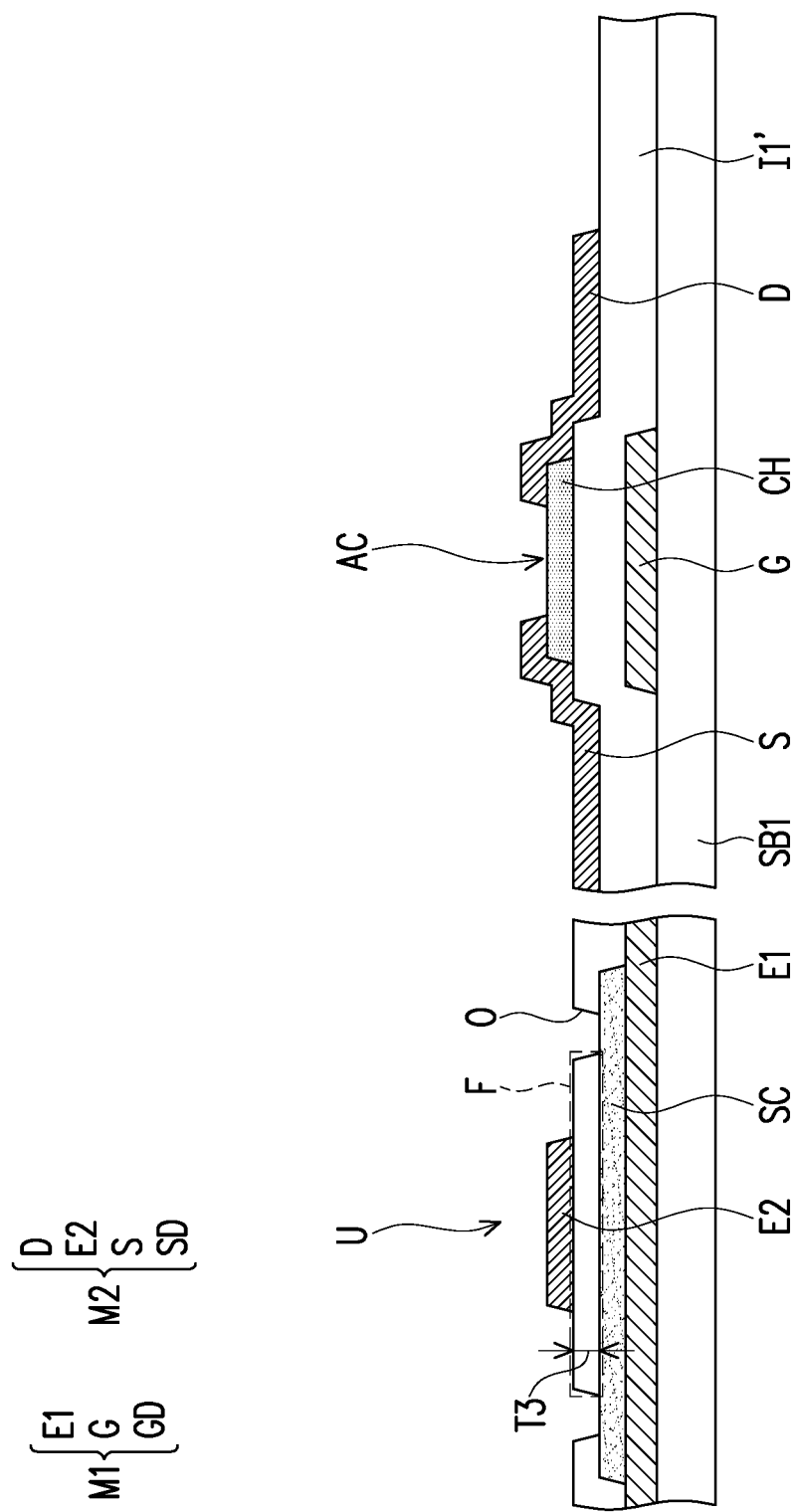

Referring to FIG. 1D, the first insulation material layer I1 is patterned to form a first insulation layer I1' including a plurality of openings O. The openings O expose the sacrificial material layers SC. In the present embodiment, the first insulation layer I1' is located between the first signal lines GD and the second signal lines SD, and the first insulation layer I1' has a plurality of thin films F located on the sacrificial material layers SC. The openings O pass through the thin films F.

A thickness T3 of the thin films F is, for example, 0.3 microns to 8 microns, but the invention is not limited thereto.

Figure 1E:
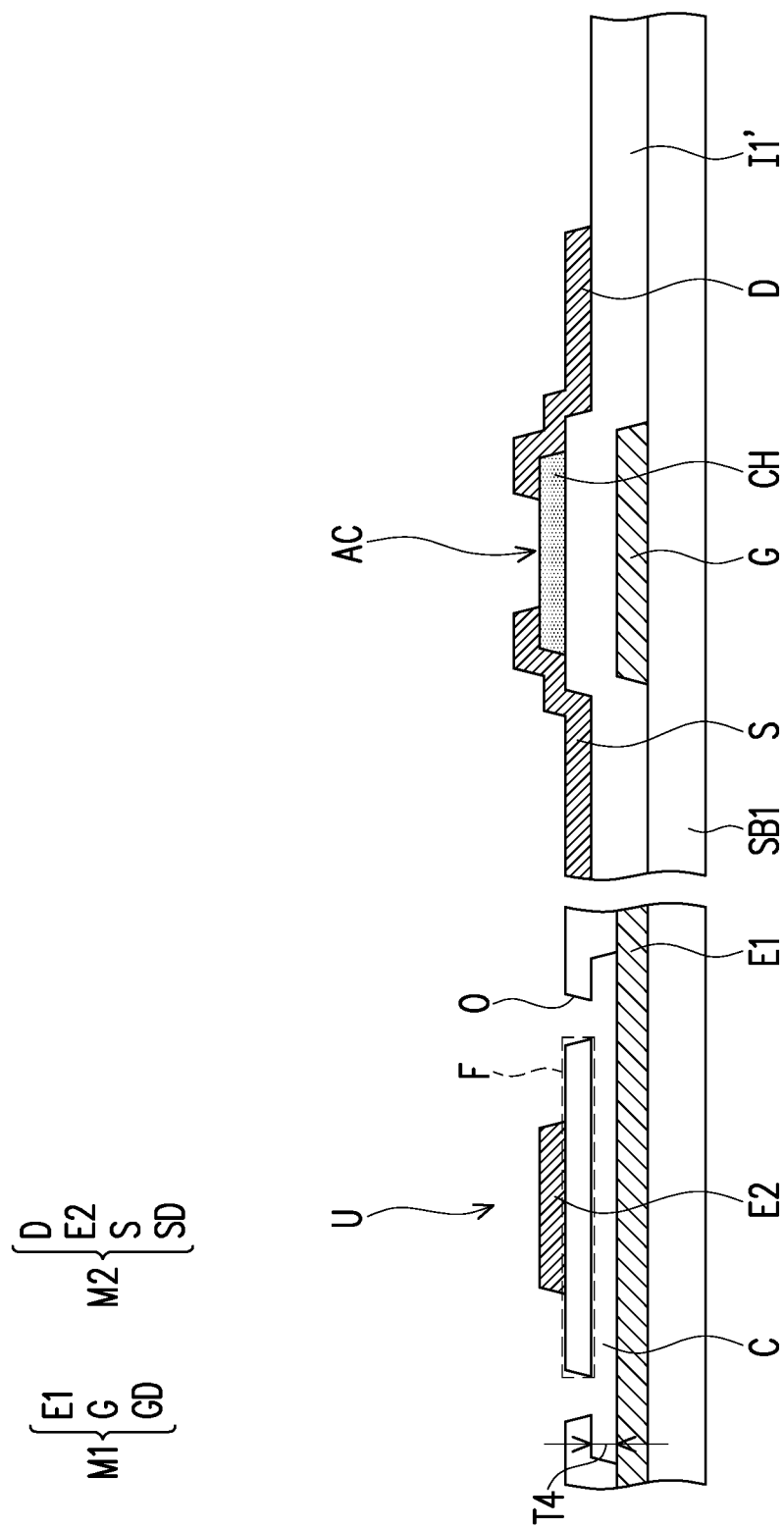

Referring to FIG. 1E, the sacrificial material layers SC are removed to form a plurality of cavities C in the first insulation layer I1'. The method for removing the sacrificial material layers SC is to etch the sacrificial material layers SC by pouring an etchant into the openings O, for example. The openings O are connected to the cavities C. In the present embodiment, each of the cavities C is connected to a plurality of openings O, and therefore, the etchant may enter and exit the cavities C more easily. The diameter of the openings O is, for example, about 5 microns.

A thickness T4 of the cavities C is, for example, between 1000 angstroms and 8000 angstroms. In the present embodiment, the range of the cavities C is defined by the first insulation layer I1' and the first electrodes E1. For example, the bottom surface of the cavities C is the first electrodes E1, and the top surface and the side surface of the cavities C are the first insulation layer I1'.

Please refer to FIG. 1E and FIG. 2, the shape of the cavities C may be designed to be circular, square, or other geometric shapes. A length L of the cavities C is, for example, about 8 microns to 20 microns, and a width W thereof is, for example, about 8 microns to 20 microns. In the present embodiment, the cavities C are substantially formed by a rectangle A, and a length L1 and a width W1 of the rectangle A are, for example, about 12 microns. A rectangle B and a rectangle B1 respectively connected to the two sides of the rectangle A each have an opening O, and a length L2 and a width W2 of the rectangle B and the rectangle B1 are, for example, about 7 microns. The openings O are mainly used as a channel of the etchant during etching, and are used to etch out the cavities C. The size, number, and shape of the rectangles B and B1 may be adjusted according to actual needs. In the present embodiment, the second electrodes E2 are overlapped with the rectangle A, and the width of the second electrodes E2 is about 5 microns to 8 microns.

In the present embodiment, ultrasonic transducers U include the first electrodes E1 and the second electrodes E2. One corresponding cavity C and one corresponding thin film F are sandwiched between the first electrodes E1 and the second electrodes E2. In the present embodiment, the ultrasonic transducers U may be used as transducers of a signal of 100 KHz to 50 MHz.

Figure 1F:
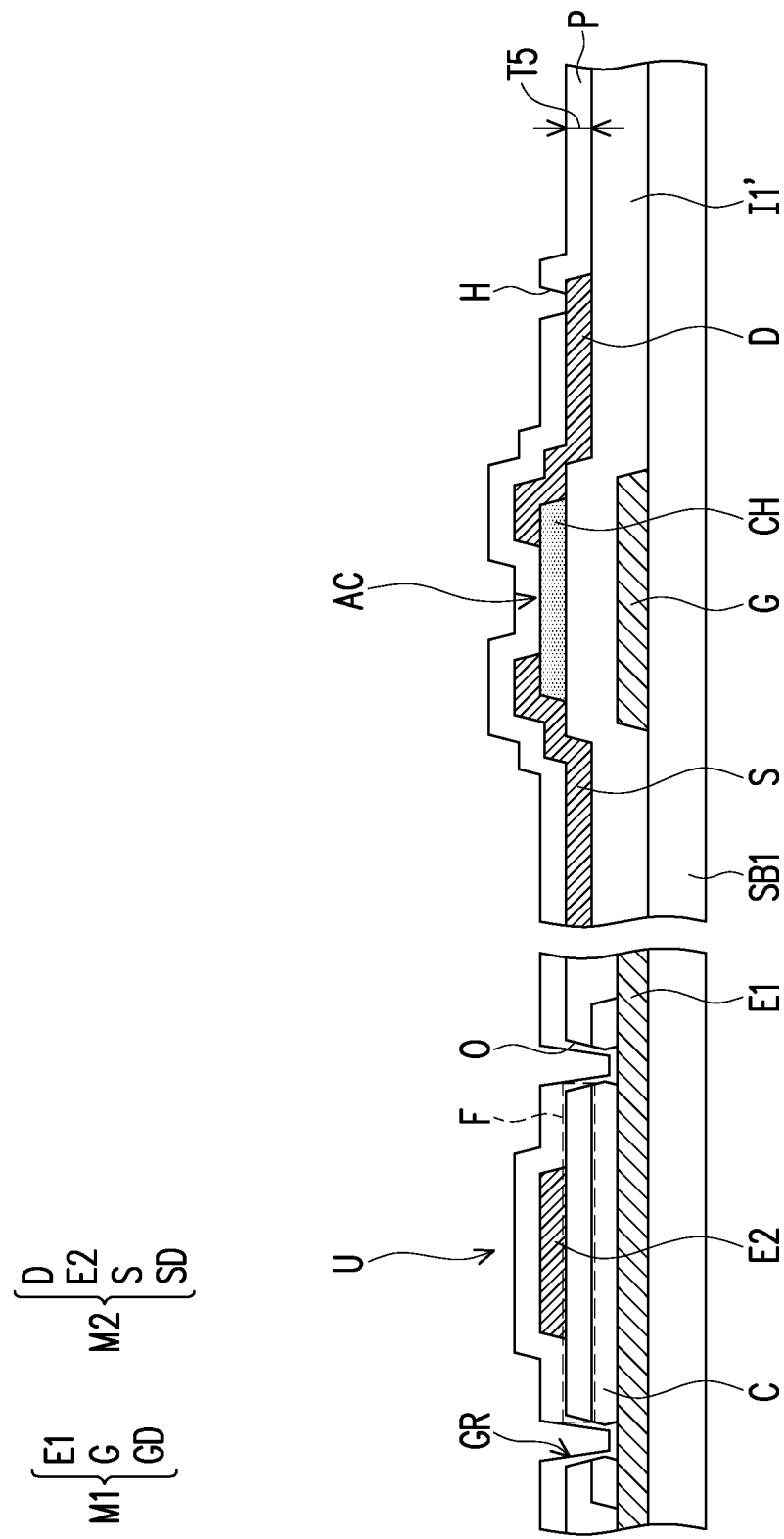

Referring to FIG. 1F, a passivation layer P is formed on the second signal lines SD, the second electrodes E2, and the first insulation layer I1'. In the present embodiment, a portion of the passivation layer P is filled in the openings O, and grooves GR are formed in the openings O. The material of the passivation layer P includes, for example, silicon oxide, silicon nitride, tetraethoxysilane (TEOS), parylene C, undoped silicon glass (USG), or other suitable materials. A thickness T5 of the passivation layer P is, for example, between 1000 angstroms and 8000 angstroms. The passivation layer P includes openings H exposing the drains D.

Figure 1G:
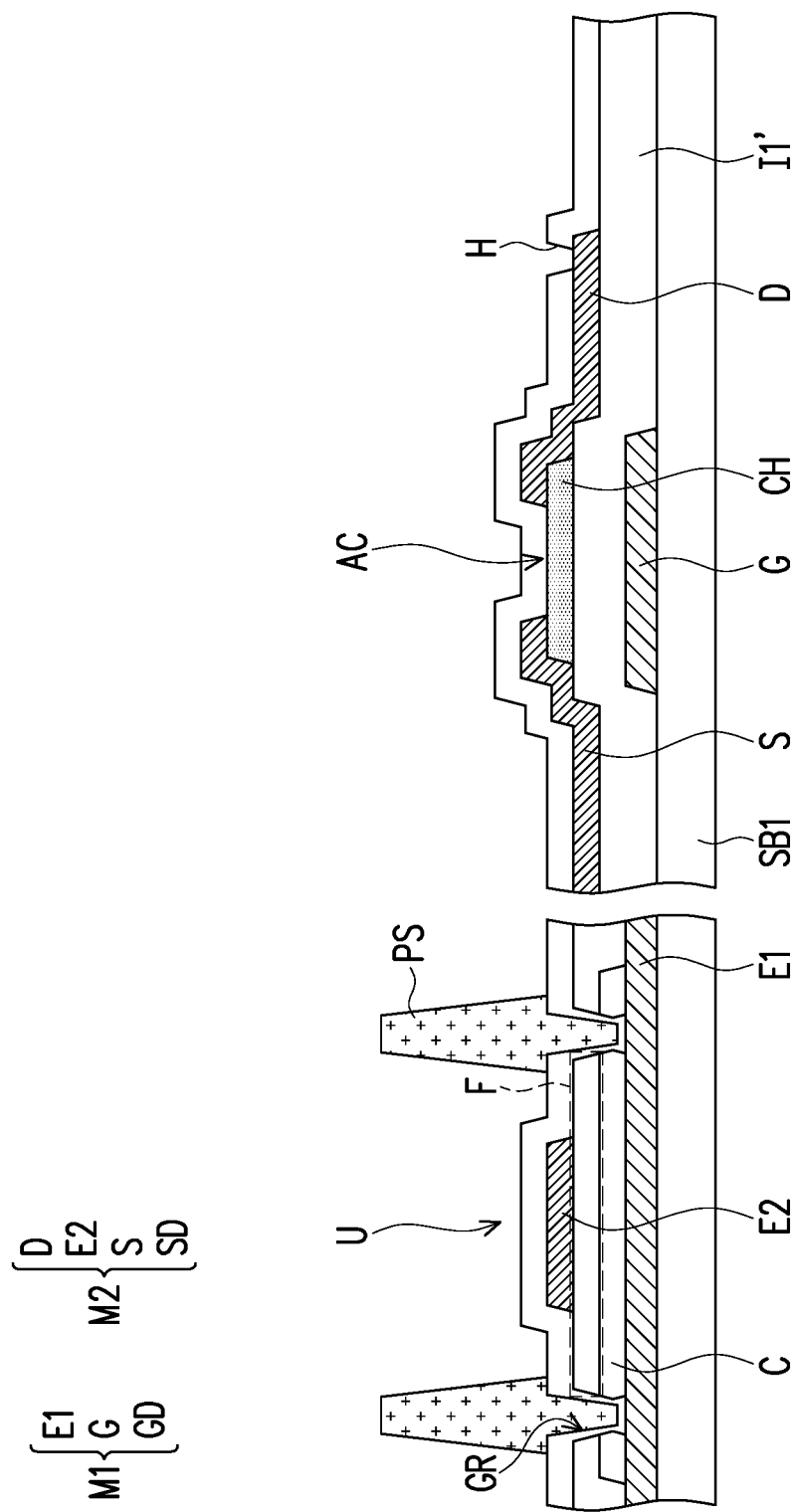

Referring to FIG. 1G, a plurality of isolation materials PS are formed in the openings O. In the present embodiment, the isolation materials PS are filled in the grooves GR of the passivation layer P. The isolation materials PS may protect the thin films F and avoid the stress concentration causing the passivation layer P at the openings O to be cracked. Therefore, the isolation materials PS may prevent the display medium (for example, liquid crystal) from flowing into the cavities C. In some embodiments, the material of the isolation materials PS includes, for example, a photoresist, or other materials suitable for spacers.

Figure 1H:
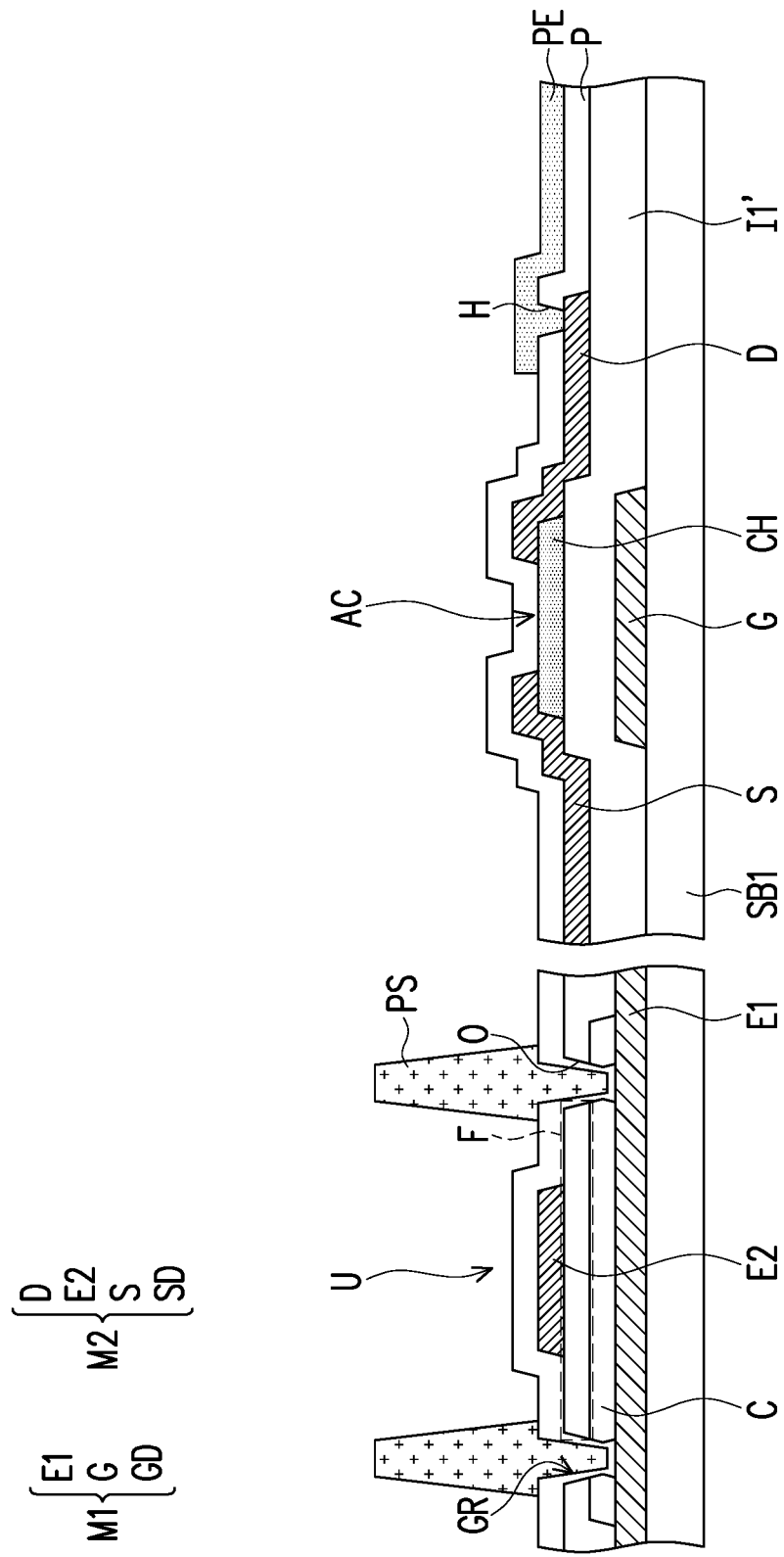

Referring to FIG. 1H, a pixel electrode PE is formed on the passivation layer P. The material of the pixel electrode PE includes, for example, indium tin oxide, indium zinc oxide, aluminum tin oxide, aluminum zinc oxide, indium germanium zinc oxide, or other suitable conductive materials or stacked layers of at least two of the above. The pixel electrode PE is electrically connected to the drains D of the active components AC via the openings H of the passivation layer P. Although in the present embodiment, the isolation materials PS are formed first, and then the pixel electrode PE is formed, the invention is not limited thereto. In other embodiments, the pixel electrode PE is formed first, and then the isolation materials PS are formed.

Figure 1I:
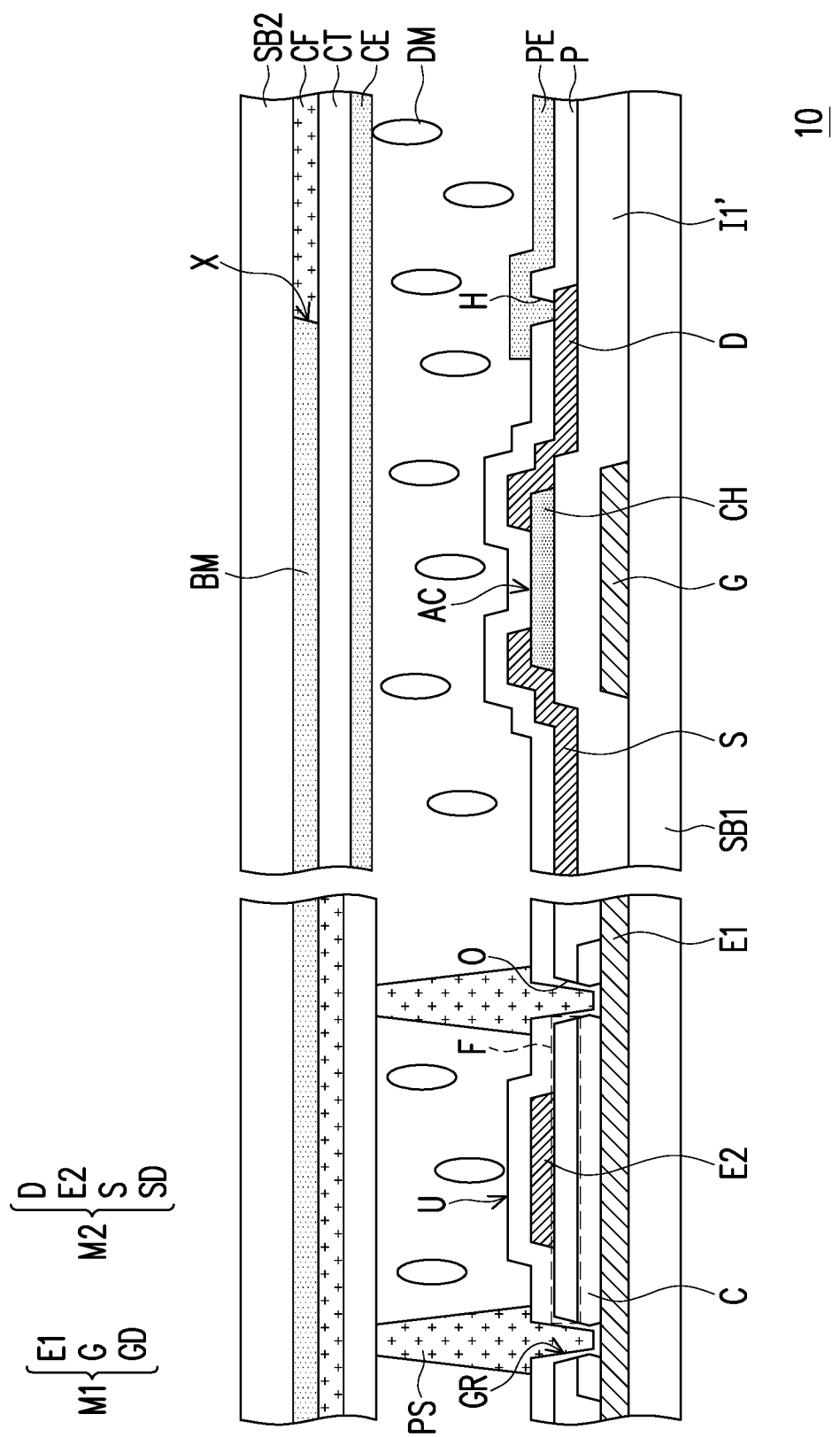

Referring to FIG. 1I and FIG. 2, a display medium layer DM is formed on the passivation layer P. In the present embodiment, the display medium DM is a liquid crystal, but the invention is not limited thereto.

A second substrate SB2 is covered on the display medium DM. The material of the second substrate SB2 may be glass, quartz, organic polymer, or other suitable materials. In some embodiments, a display device 10 is a flexible display device, and the first substrate SB1 and the second substrate SB2 are both flexible materials, but the invention is not limited thereto.

In the present embodiment, a black matrix BM, a color filter component CF, a protective layer CT, and a common electrode CE are formed on the second substrate SB2, but the invention is not limited thereto. In other embodiments, the common electrode CE is formed on the first substrate SB1. In the present embodiment, a polarizing film (not shown) is further provided on the outside of the second substrate SB2 and the first substrate SB1.

In the present embodiment, the black matrix BM is overlapped with the ultrasonic transducers U, the first signal lines GD, the second signal lines SD, and the active components AC. Since the black matrix BM is overlapped with the ultrasonic transducers U, the ultrasonic transducers U may perform an ultrasonic sensing function (such as a fingerprint recognition function, a touch function, a medical sensing function, or other similar functions) without affecting the aperture ratio of the display device 10. In the present embodiment, the ultrasonic wave emitted by the ultrasonic transducers U is reflected when encountering air and penetrates skin upon contact with the skin, thereby sensing fingerprints on the skin.

In the present embodiment, the isolation materials PS are located between the first substrate SB1 and the second substrate SB2, and may be used as spacers between the first substrate SB1 and the second substrate SB2. In other words, the isolation materials PS may be used to maintain the distance between the first substrate SB1 and the second substrate SB2.

In the present embodiment, a portion of the color filter component CF is located in openings X of the black matrix BM, and a portion of the color filter component CF is overlapped with the isolation materials PS in a direction perpendicular to the second substrate SB2, thereby better maintaining the distance between the first substrate SB1 and the second substrate SB2, but the invention is not limited thereto. In other embodiments, the color filter component CF is not overlapped with the isolation materials PS in a direction perpendicular to the second substrate SB2.

In the present embodiment, the display device 10 includes the first substrate SB1, the second substrate SB2, a plurality of first signal lines, a plurality of second signal lines, the first insulation layer I1', the plurality of active components AC, the display medium layer DM, and the plurality of ultrasonic transducers U.

The first signal lines and the second signal lines are located on the first substrate SB. The first insulation layer I1' is located between the first signal lines and the second signal lines. The plurality of cavities C are located in the first insulation layer I1'. The first insulation layer I1' has the plurality of thin films F located on the cavities C. The active components AC are electrically connected to the first signal lines and the second signal lines. The display medium layer DM is located between the first substrate SB1 and the second substrate SB2. The ultrasonic transducers U are located between the first substrate SB1 and the second substrate SB2, wherein each of the ultrasonic transducers U includes the first electrode E1 and the second electrode E2. The first electrode E1 and a corresponding first signal line belong to a same layer and are electrically connected with each other. The second electrode E2 and a corresponding second signal line belong to a same layer and are electrically connected with each other. One corresponding cavity C and one corresponding thin film F are sandwiched between the first electrode E1 and the second electrode E2.

Based on the above, the ultrasonic transducers U of the display device 10 include the first electrodes E1 in the same layer as the first signal lines GD and the second electrodes E2 in the same layer as the second signal lines SD. Therefore, the influence on the thickness of the display device 10 by the ultrasonic transducers U may be reduced.

In the present embodiment, the ultrasonic transducers U of the display device 10 are located between the first substrate SB1 and the second substrate SB2. In other embodiments, the display device 10 may further include other ultrasonic transducers located outside the first substrate SB1 or the second substrate SB2.

Figure 3A:
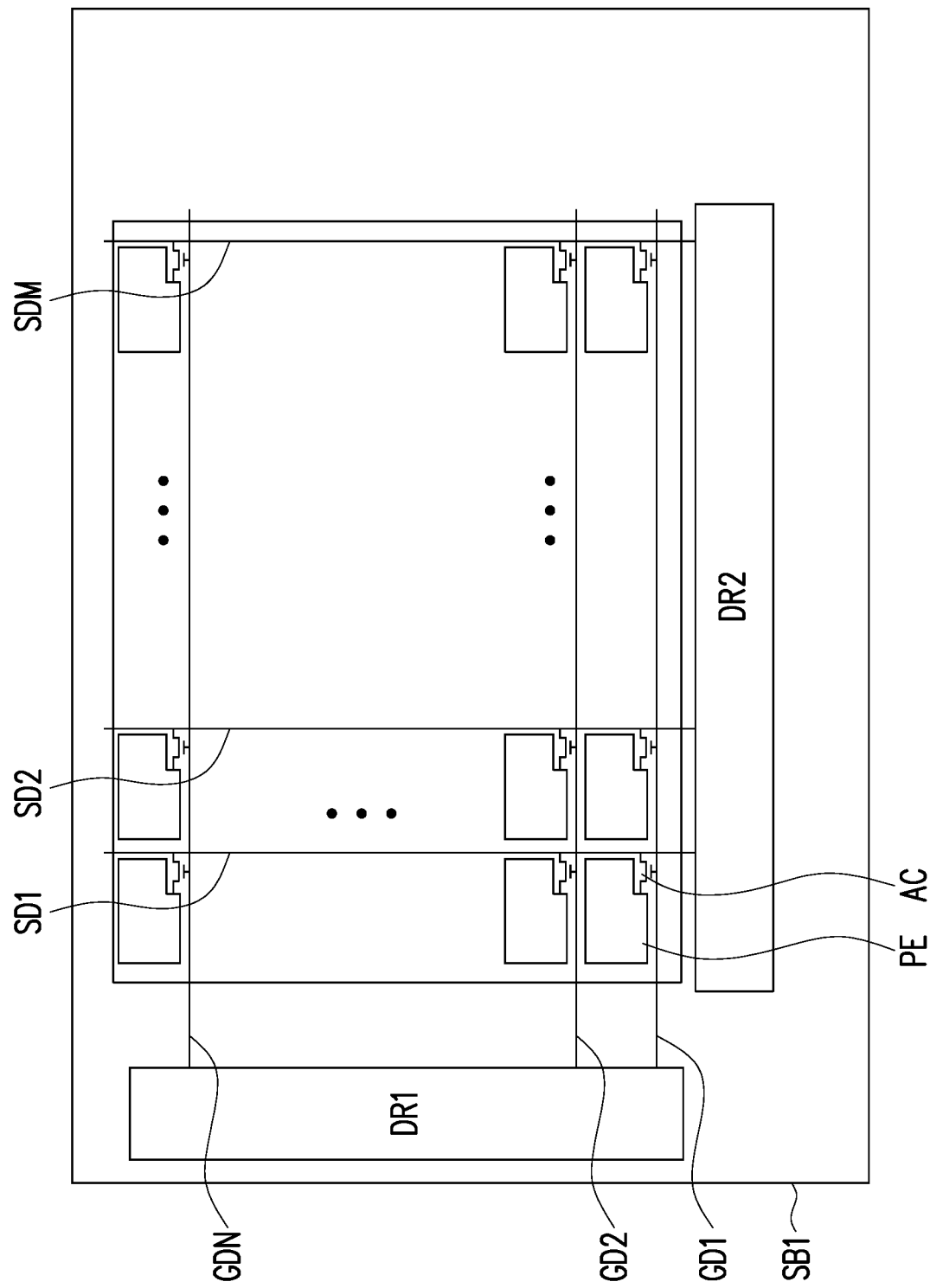
FIG. 3A is a top view of a display device of an embodiment of the invention.
Figure 3B:
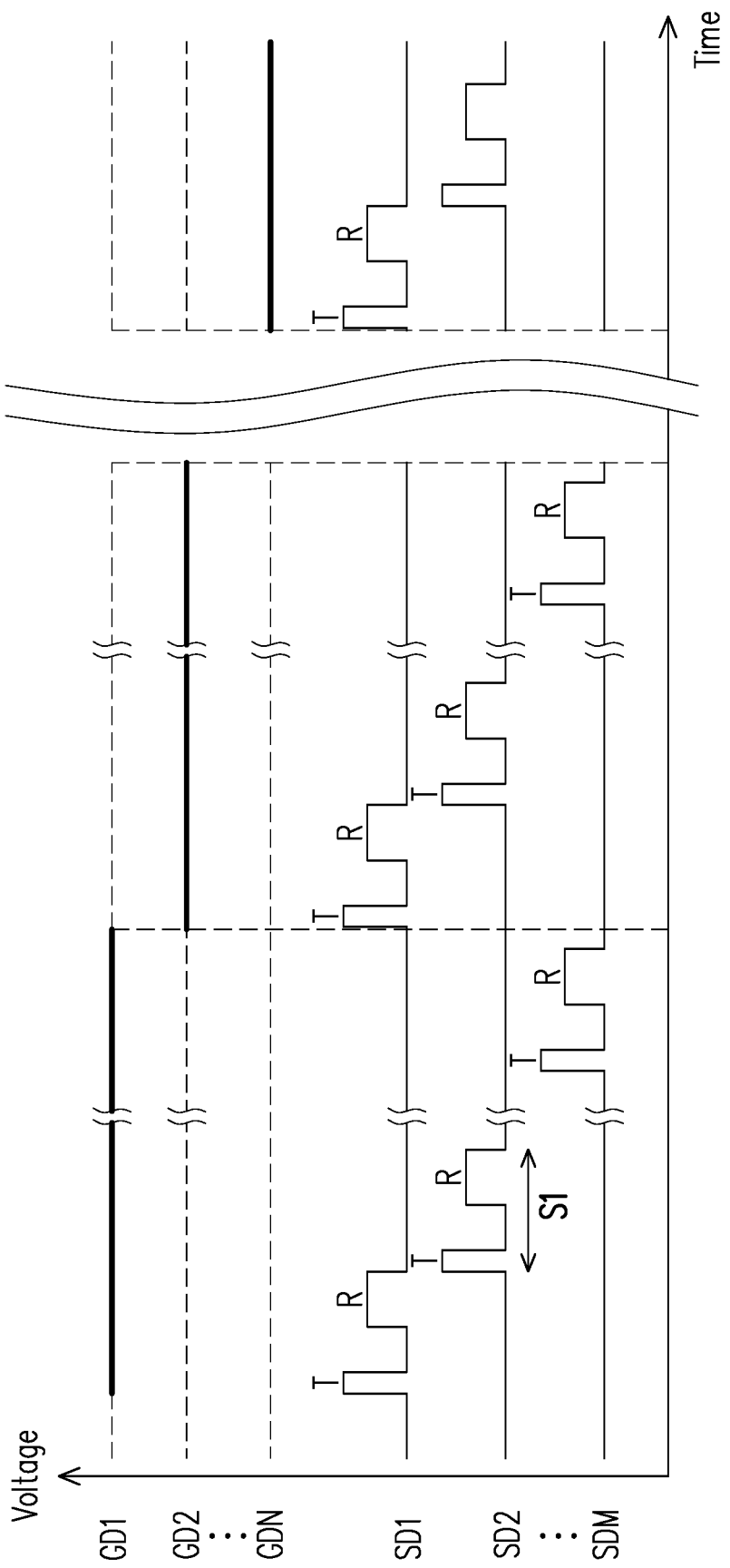
FIG. 3B is a signal waveform diagram of a display device of an embodiment of the invention.
Figure 3C:
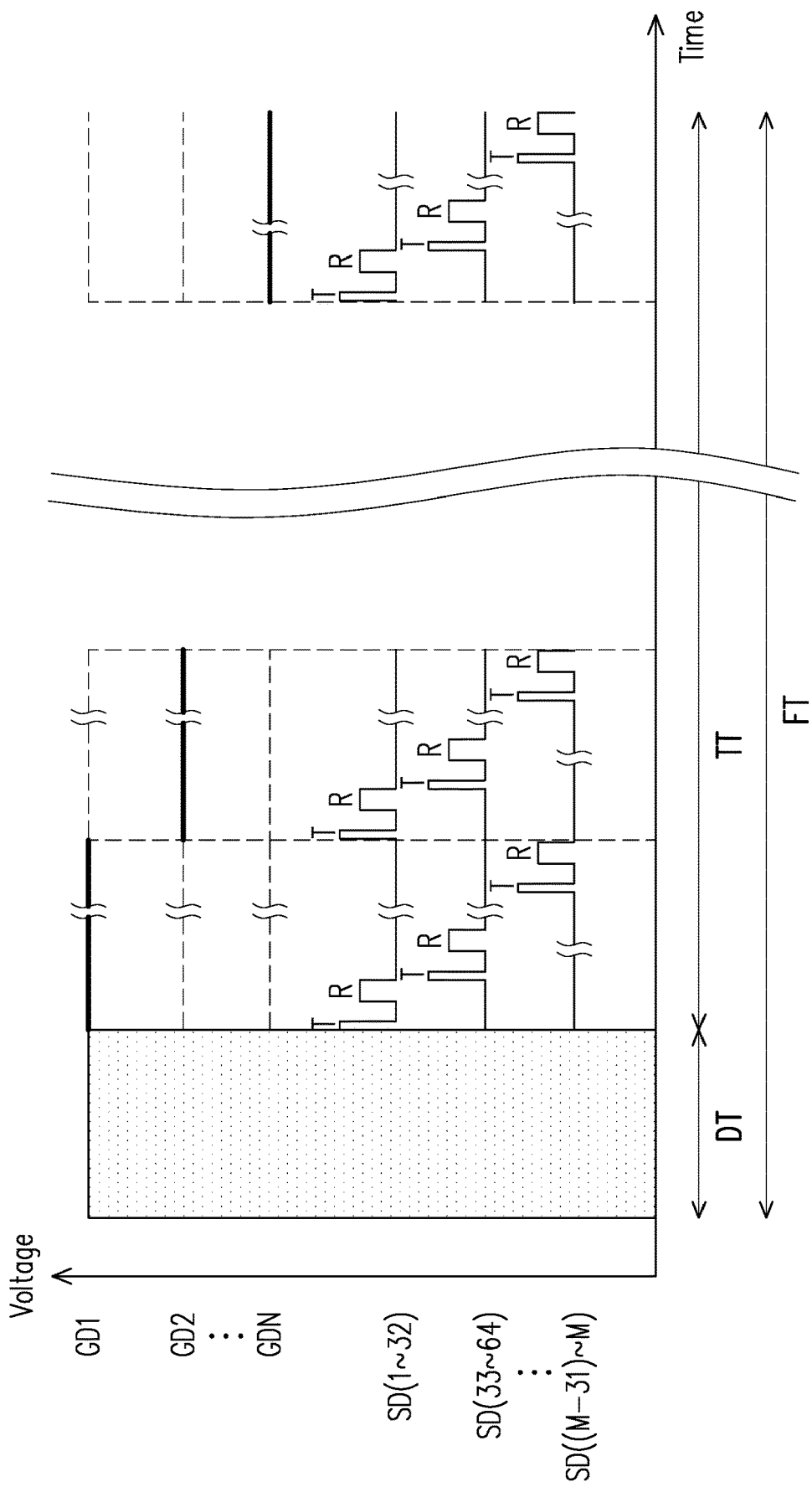
FIG. 3C is a signal waveform diagram of a display device of an embodiment of the invention.

FIG. 3A is a top view of a display device of an embodiment of the invention. FIG. 3B is a signal waveform diagram of a display device of an embodiment of the invention. FIG. 3C is a signal waveform diagram of a display device of an embodiment of the invention.

It should be mentioned here that, the embodiment of FIG. 3A to FIG. 3C adopts the reference numerals of the embodiments of FIG. 1A to FIG. 1I and FIG. 2 and a portion of the contents thereof, wherein the same or similar numerals are used to represent the same or similar devices and descriptions of the same technical contents are omitted. The omitted portions are as described in the above embodiments and are not repeated herein.

In the present embodiment, the display device includes first signal lines GD1 to GDN and second signal lines SD1 to SDM, wherein the first signal lines GD1 to GDN are, for example, electrically connected to the first electrodes of the ultrasonic transducers (not shown in FIG. 3A) and the gates of the active components AC, and the second signal lines SD1 to SDM are electrically connected to the second electrodes of the ultrasonic transducers and the sources of the active components AC. The extending direction of the first signal lines GD1 to GDN is staggered with the extending direction of the second signal lines SD1 to SDM.

In the present embodiment, the first signal lines GD1 to GDN are electrically connected to a first driving circuit DR1, and the second signal lines SD1 to SDM are electrically connected to a second driving circuit DR2.

Please refer to FIG. 3B. In the present embodiment, the fingerprint recognition function is performed in a black screen. In other words, when scanning a fingerprint, the screen is temporarily blank. A pinch-off voltage is generated by the first signal lines GD1 to GDN and the second signal lines SD1 to SDM in sequence. As shown in FIG. 3B, the solid line portion corresponding to the first signal lines GD1 to GDN represents a pinch-off voltage is generated with the second signal lines SD1 to SDM. For example, a reference voltage (for example, 0 volts but not limited thereto) is applied to one of the first signal lines GD1 to GDN, so that one of the first signal lines GD1 to GDN generates a pinch-off voltage T with the second signal lines SD1 to SDM. The dashed line portion corresponding to the first signal lines GD1 to GDN represents a pinch-off voltage is not generated with the second signal lines SD1 to SDM. For example, the first signal lines GD1 to GDN that do not generate a pinch-off voltage with the second signal lines SD1 to SDM are in a floating state. When the first signal line GD1 and the second signal lines SD1 to SDM sequentially generate the pinch-off voltage T, the ultrasonic transducers emit an ultrasonic wave. When the ultrasonic wave emitted by the ultrasonic transducers is reflected back to the ultrasonic transducers by an object (such as a finger), the ultrasonic transducers receive the ultrasonic wave and correspondingly make the first signal line GD1 and the second signal lines SD1 to SDM generate a pinch-off voltage R. Then, the first signal lines GD2 to GDN are scanned in a similar manner, and details are not repeated herein. In the present embodiment, the pinch-off voltage T is, for example, between 5 volts and 100 volts.

In the present embodiment, the ultrasonic transducers may receive a signal generated after an ultrasonic wave emitted by the ultrasonic transducers is reflected. In other words, the same ultrasonic transducer may perform the functions of transmitting signals and receiving signals, but the invention is not limited thereto. In other embodiments, a portion of the ultrasonic transducers is responsible for performing the function of transmitting signals, and another portion of the ultrasonic transducers is responsible for performing the function of receiving signals.

In some embodiments, a time S1 needed for the ultrasonic transducers to apply the pinch-off voltage T so as to transmit the signal until receiving the signal and generating the pinch-off voltage R is about 150 ns to 700 ns.

Please refer to FIG. 3C. In the present embodiment, a display function time DT and a touch function time TT are included in a frame time FT.

In the display function time DT, a voltage is sequentially applied to the first signal lines GD1 to GDN (not shown in FIG. 3C). When a voltage is applied to the first signal line GD1, a voltage is sequentially applied to the second signal lines SD1 to SDM (not shown in FIG. 3C) to charge the pixels. Then, the first signal lines GD2 to GDN are scanned in a similar manner, and details are not repeated herein.

During the touch function time TT, a voltage is sequentially applied to the first signal lines GD1 to GDN. When the first signal line GD1 and the second signal lines SD1 to SDM sequentially generate the pinch-off voltage T, the ultrasonic transducers emit an ultrasonic wave. In the present embodiment, a plurality of second signal lines and the first signal line GD1 simultaneously generate the pinch-off voltage T to reduce the proportion of the touch function time TT in the frame time FT, so that the pixels may be charged in sufficient display function time DT. In the present embodiment, the pinch-off voltage T is generated by 32 second signal lines and the first signal line GD1 at a time, but the invention is not limited thereto. In other embodiments, the number of second signal lines to which voltage is applied at a time may be adjusted according to actual needs.

When the ultrasonic wave emitted by the ultrasonic transducers is reflected back to the ultrasonic transducers by an object (such as a finger), the ultrasonic transducers receive the signal and correspondingly make the first signal line GD1 and the second signal lines SD1 to SDM generate the pinch-off voltage R. Then, the first signal lines GD2 to GDN are scanned in a similar manner, and details are not repeated herein.

FIG. 4A to FIG. 4E are cross-sectional views of a manufacturing method of a display device according to an embodiment of the invention.

It should be mentioned here that, the embodiment of FIG. 4A to FIG. 4E adopts the reference numerals of the embodiments of FIG. 1A to FIG. 1I and FIG. 2 and a portion of the contents thereof, wherein the same or similar numerals are used to represent the same or similar devices and descriptions of the same technical contents are omitted. The omitted portions are as described in the above embodiments and are not repeated herein.

Figure 4A:
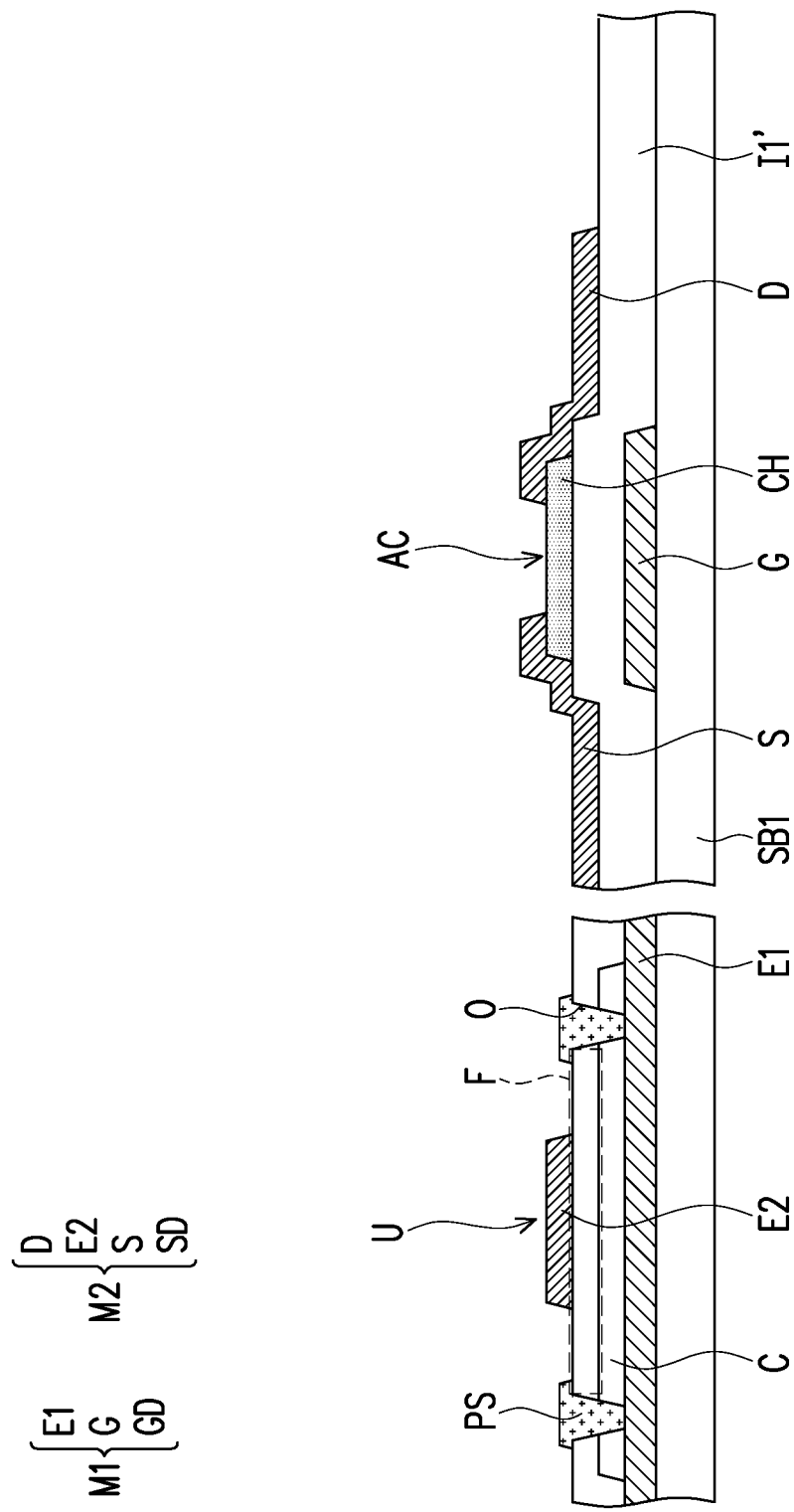
FIG. 4A to FIG. 4E are cross-sectional views of a manufacturing method of a display device according to an embodiment of the invention.

FIG. 4A is subsequent to FIG. 1E. After the sacrificial material layers SC are removed to form the plurality of cavities C in the first insulation layer I1', the plurality of isolation materials PS are formed in the openings O.

Figure 4B:
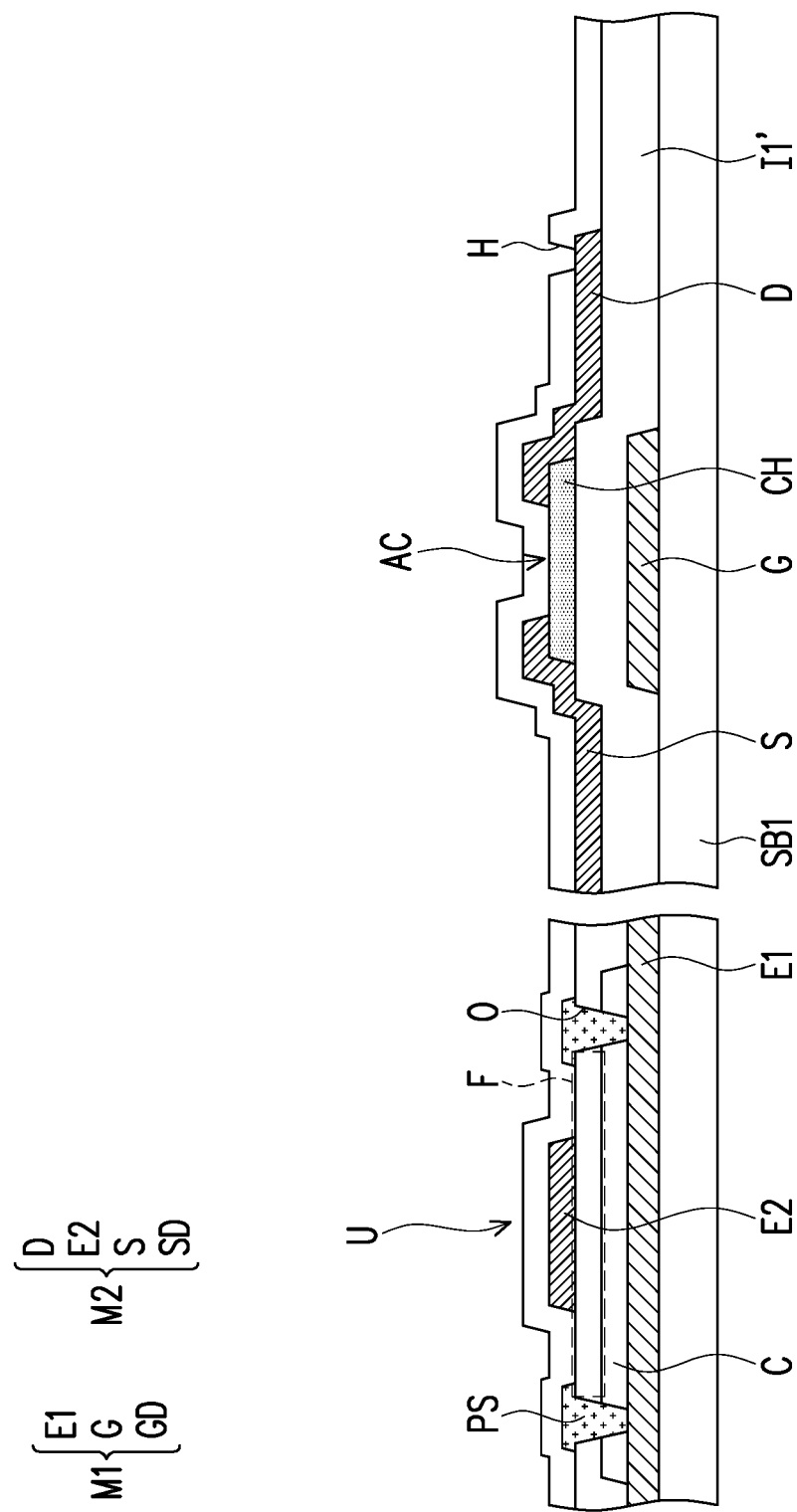

Referring to FIG. 4B, the passivation layer P is formed on the second signal lines SD, the second electrodes E2, and the first insulation layer I1'. In the present embodiment, a portion of the passivation layer P covers the openings O and the isolation materials PS in the openings O. The passivation layer P includes the openings H exposing the drains D.

Figure 4C:
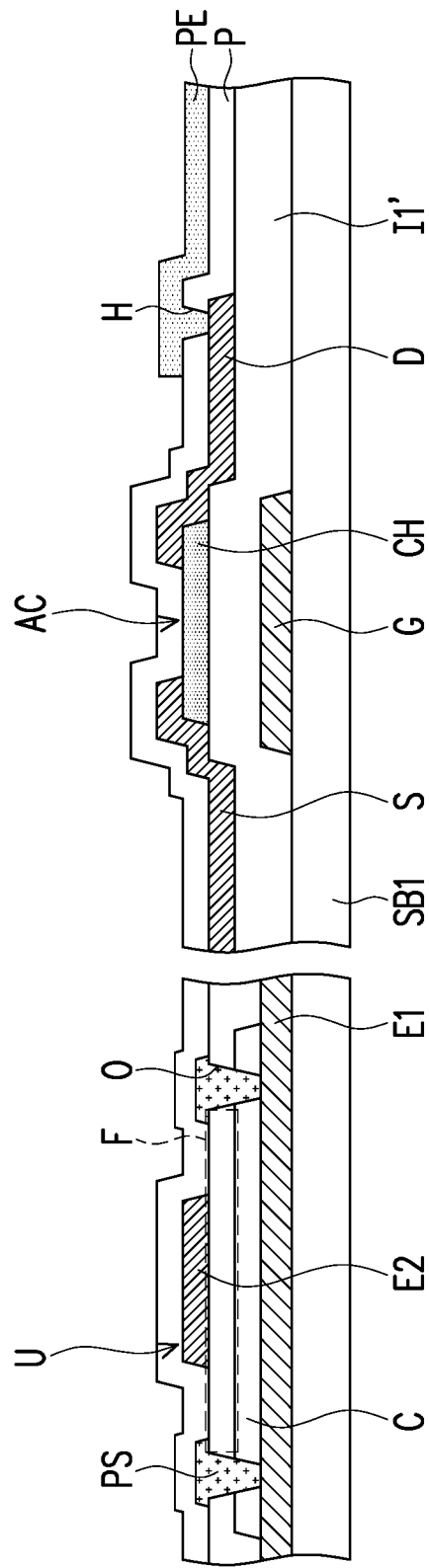

Referring to FIG. 4C, the pixel electrode PE is formed on the passivation layer P. The pixel electrode PE is electrically connected to the drains D of the active components AC via the openings H of the passivation layer P.

Figure 4D:
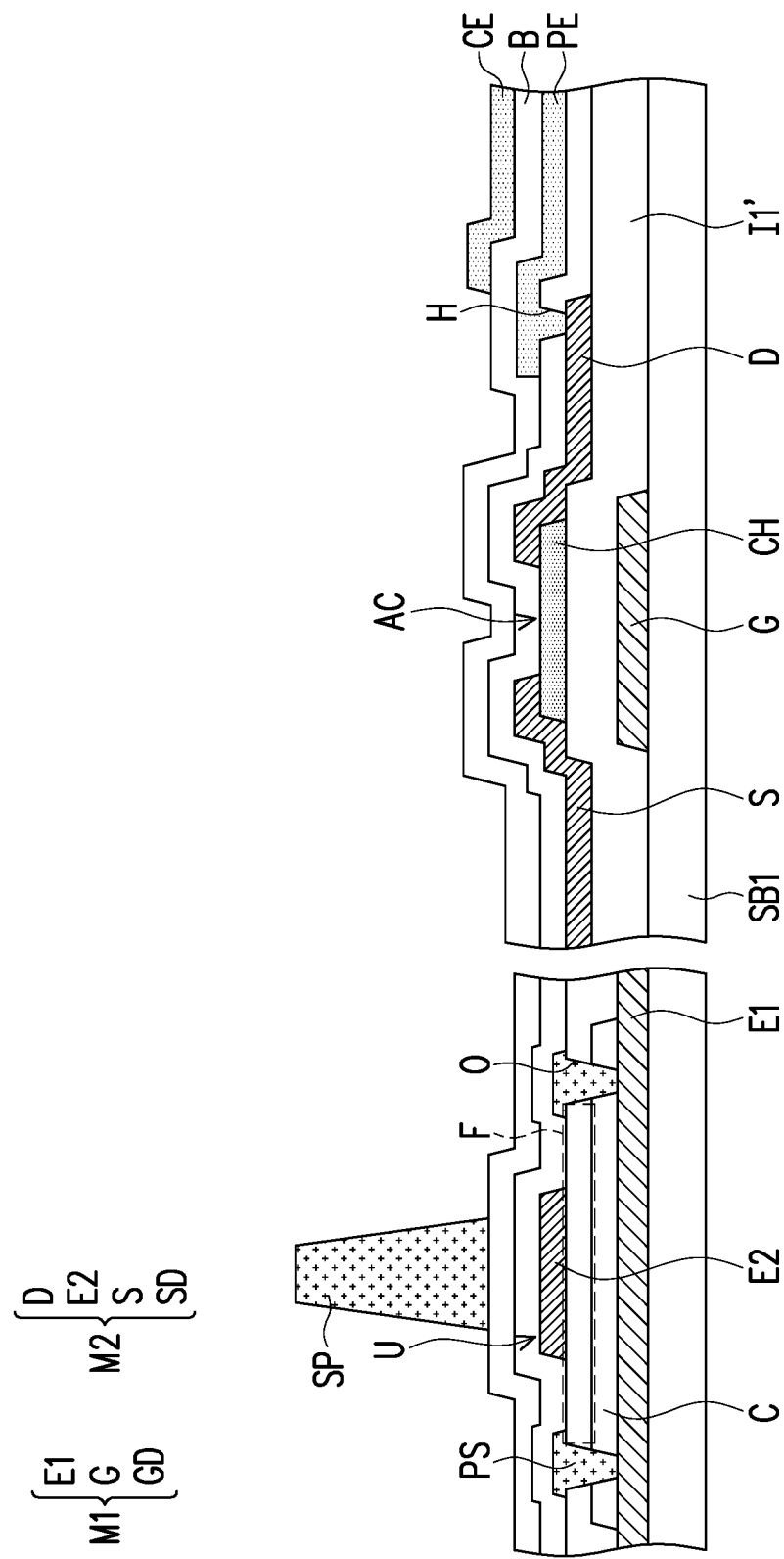

Referring to FIG. 4D, an insulation layer B is formed on the pixel electrode PE. The common electrode CE is formed on the insulation layer B. The common electrode CE is overlapped with the pixel electrode PE. In the present embodiment, the display device controls the rotation of the liquid crystal by, for example, an in-plane switching (IPS) technique or a fringe-field switching (FFS) technique.

Spacers SP is formed on the insulation layer B. In the present embodiment, the spacers SP are overlapped with the cavities C.

Figure 4E:
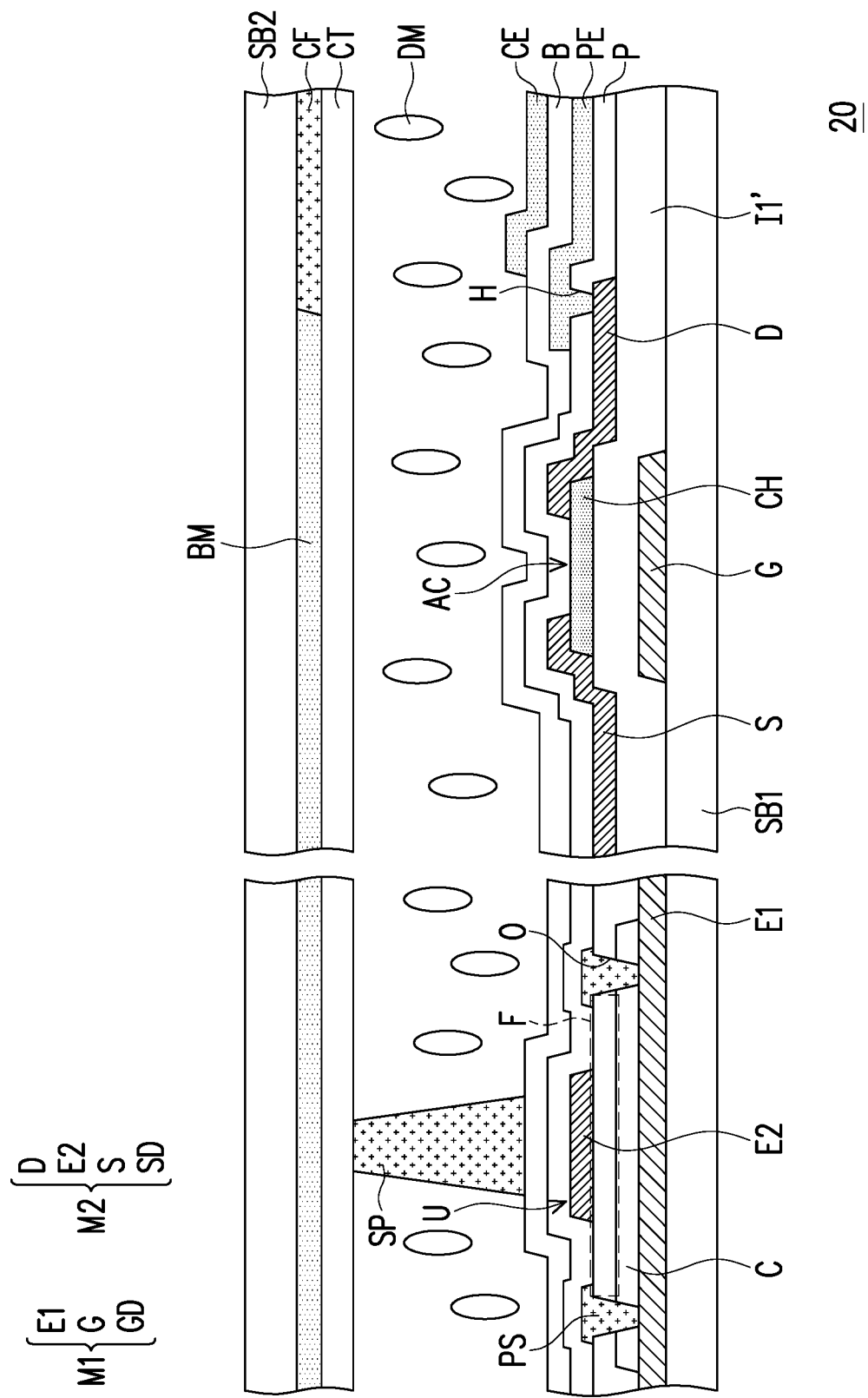

Referring to FIG. 4E, the display medium layer DM is formed on the passivation layer P. In the present embodiment, the display medium DM is a liquid crystal. The second substrate SB2 is covered on the display medium DM. In the present embodiment, the spacers SP are located between the first substrate SB1 and the second substrate SB2, and may be used to maintain the distance between the first substrate SB1 and the second substrate SB2.

In the present embodiment, the black matrix BM, the color filter component CF, and the protective layer CT are formed on the second substrate SB2.

In the present embodiment, the black matrix BM is overlapped with the ultrasonic transducers U, the first signal lines GD, the second signal lines SD, and the active components AC. The black matrix BM is overlapped with the ultrasonic transducers U. Therefore, the ultrasonic transducers U may perform an ultrasonic sensing function without affecting the aperture ratio of a display device 20.

In the present embodiment, the display device 20 includes the first substrate SB1, the second substrate SB2, a plurality of first signal lines, a plurality of second signal lines, the first insulation layer I1', the plurality of active components AC, the display medium layer DM, and the plurality of ultrasonic transducers U.

The first signal lines and the second signal lines are located on the first substrate SB. The first insulation layer I1' is located between the first signal lines and the second signal lines. The plurality of cavities C are located in the first insulation layer I1'. The first insulation layer I1' has the plurality of thin films F located on the cavities C. The active components AC are electrically connected to the first signal lines and the second signal lines. The display medium layer DM is located between the first substrate SB1 and the second substrate SB2. The ultrasonic transducers U are located between the first substrate SB1 and the second substrate SB2, wherein each of the ultrasonic transducers U includes the first electrode E1 and the second electrode E2. The first electrode E1 and a corresponding first signal line belong to a same layer and are electrically connected with each other. The second electrode E2 and a corresponding second signal line belong to a same layer and are electrically connected with each other. One corresponding cavity C and one corresponding thin film F are sandwiched between the first electrode E1 and the second electrode E2.

Based on the above, the ultrasonic transducers U of the display device 20 include the first electrodes E1 in the same layer as the first signal lines and the second electrodes E2 in the same layer as the second signal lines. Therefore, the influence on the thickness of the display device 20 by the ultrasonic transducers U may be reduced.

Figure 5:
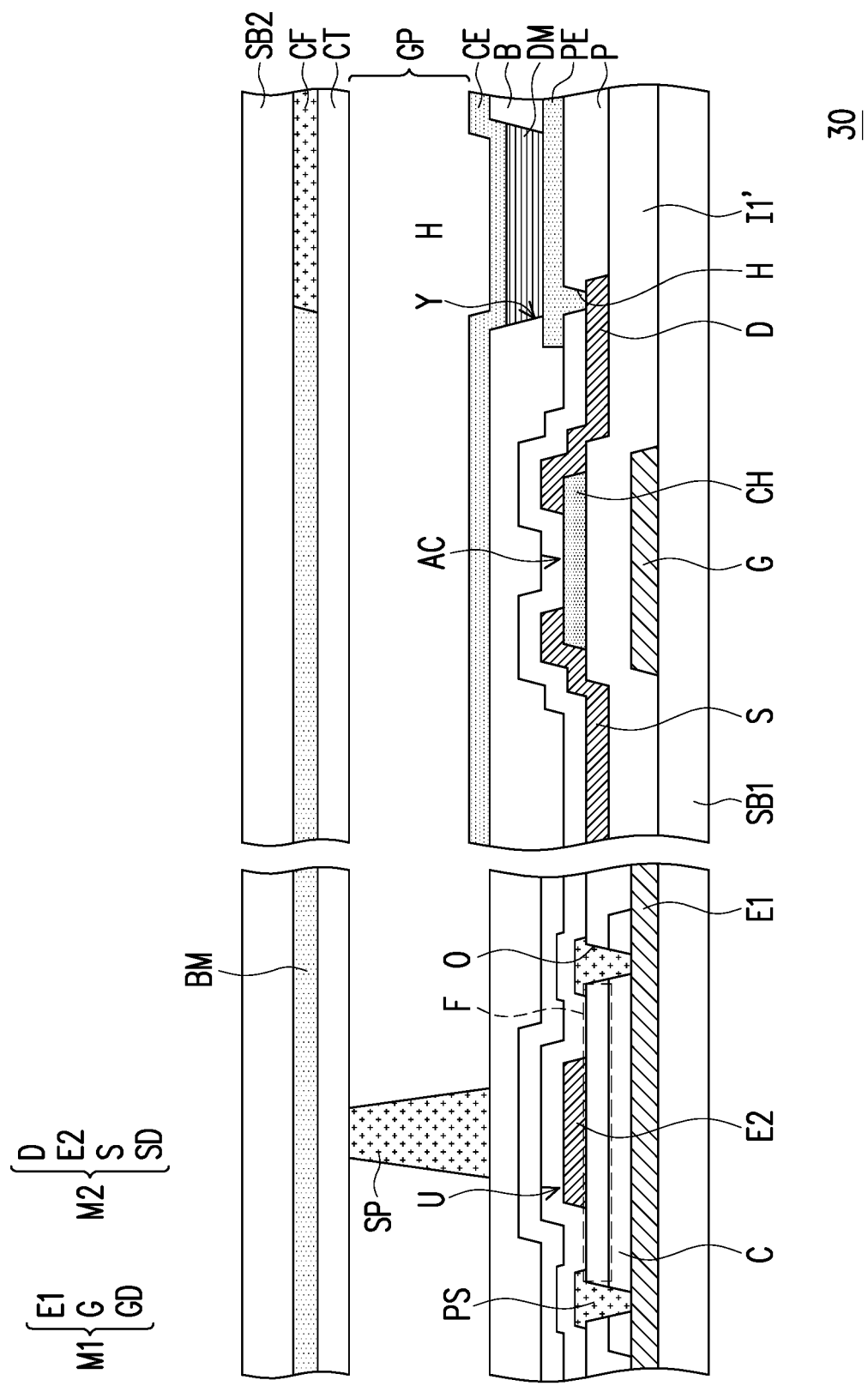
FIG. 5 is a cross-sectional view of a display device according to an embodiment of the invention.

FIG. 5 is a cross-sectional view of a display device according to an embodiment of the invention.

It should be mentioned here that, the embodiment of FIG. 5 adopts the reference numerals of the embodiment of FIG. 4A to FIG. 4E and a portion of the contents thereof, wherein the same or similar numerals are used to represent the same or similar devices and descriptions of the same technical contents are omitted. The omitted portions are as described in the above embodiments and are not repeated herein.

Referring to FIG. 5, a display device 30 includes the first substrate SB1, the second substrate SB2, a plurality of first signal lines, a plurality of second signal lines, the first insulation layer I1', the plurality of active components AC, the display medium layer DM, and the plurality of ultrasonic transducers U.

The first signal lines and the second signal lines are located on the first substrate SB. The first insulation layer I1' is located between the first signal lines and the second signal lines. The plurality of cavities C are located in the first insulation layer I1'. The first insulation layer I1' has the plurality of thin films F located on the cavities C. The active components AC are electrically connected to the first signal lines and the second signal lines. The display medium layer DM is located between the first substrate SB1 and the second substrate SB2. The ultrasonic transducers U are located between the first substrate SB1 and the second substrate SB2, wherein each of the ultrasonic transducers U includes the first electrode E1 and the second electrode E2. The first electrode E1 and a corresponding first signal line belong to a same layer and are electrically connected with each other. The second electrode E2 and a corresponding second signal line belong to a same layer and are electrically connected with each other. One corresponding cavity C and one corresponding thin film F are sandwiched between the first electrode E1 and the second electrode E2.

In the present embodiment, the insulation layer B is formed on the pixel electrode PE and has a plurality of openings Y. The openings Y expose the pixel electrode PE. The display medium layer DM is formed in the openings Y and is in contact with the pixel electrode PE. In the present embodiment, the material of the display medium layer DM includes an organic light-emitting material or an inorganic light-emitting diode (for example, a micro LED).

The common electrode CE is formed on the insulation layer B and the display medium layer DM, and is in contact with the display medium layer DM. In the present embodiment, a gap GP between the first substrate SB1 and the second board SB2 may also be filled with a soft material (such as optical glue, water-blocking glue, frame glue, thermally conductive glue, non-polar liquid, or other materials suitable acoustic impedance) to help the transmission of ultrasonic waves.

Based on the above, the ultrasonic transducers U of the display device 30 include the first electrodes E1 in the same layer as the first signal lines and the second electrodes E2 in the same layer as the second signal lines. Therefore, the influence on the thickness of the display device 30 by the ultrasonic transducers U may be reduced.

What is claimed is:
1. A display device, comprising:
   a first substrate and a second substrate;
   a plurality of first signal lines and a plurality of second signal lines located on the first substrate;
   a first insulation layer located between the first signal lines and the second signal lines, wherein a plurality of cavities are located in the first insulation layer, and the first insulation layer has a plurality of thin films located on the cavities;
   a plurality of active components electrically connected to the first signal lines and the second signal lines;
   a display medium layer located between the first substrate and the second substrate; and
   a plurality of ultrasonic transducers located between the first substrate and the second substrate, wherein each of the ultrasonic transducers comprises:
      a first electrode, wherein the first electrode and one of the first signal lines belong to a same layer and are electrically connected with each other; and
      a second electrode, wherein the second electrode and one of the second signal lines belong to a same layer and are electrically connected with each other, and one of the cavities and one of the thin films are sandwiched between the first electrode and the second electrode.

2. The display device of claim 1, wherein a range of the cavities is defined by the first insulation layer and the first electrodes.

3. The display device of claim 1, further comprising:
   a black matrix formed on the second substrate and overlapped with the ultrasonic transducers.

4. The display device of claim 1, further comprising:
   a plurality of spacers located between the first substrate and the second substrate and overlapped with the cavities.

5. The display device of claim 1, further comprising:
   a plurality of isolation materials located between the first substrate and the second substrate, wherein the first insulation layer further comprises a plurality of openings, the openings are connected to the cavities, and the isolation materials are filled in the openings.

6. The display device of claim 1, further comprising:
   a passivation layer located on the second signal lines, the second electrodes, and the first insulation layer, wherein the first insulation layer further comprises a plurality of openings, the openings are connected to the cavities, a portion of the passivation layer is filled in the openings, and the passivation layer has a plurality of grooves corresponding to the openings.

7. The display device of claim 6, further comprising:
   a plurality of isolation materials located between the first substrate and the second substrate, and the isolation materials are filled in the grooves.

8. The display device of claim 1, wherein the ultrasonic transducers are suitable for fingerprint recognition.

9. The display device of claim 1, wherein the display medium layer comprises a liquid crystal or an organic light-emitting material.

10. A manufacturing method of a display device, comprising:
    providing a first substrate;
    forming a first conductive layer on the first substrate, wherein the first conductive layer comprises a plurality of first signal lines and a plurality of first electrodes connected to the first signal lines;

forming a plurality of sacrificial material layers on the first electrodes;

forming a first insulation material layer to cover the first signal lines, the first electrodes, and the sacrificial material layers;

forming a second conductive layer on the first insulation material layer, wherein the second conductive layer comprises a plurality of second signal lines and a plurality of second electrodes connected to the second signal lines;

patterning the first insulation material layer to form a first insulation layer comprising a plurality of openings, wherein the openings expose the sacrificial material layers, and the first insulation layer has a plurality of thin films located on the sacrificial material layers;

removing the sacrificial material layers to form a plurality of cavities in the first insulation layer, wherein the cavities and the thin films are sandwiched between the first electrodes and the second electrodes;

forming a passivation layer on the second conductive layer and the first insulation layer;

forming a display medium layer on the passivation layer; and covering a second substrate on the display medium.

11. The manufacturing method of the display device of claim 10, further comprising:

forming a plurality of isolation materials in the openings.

12. The manufacturing method of the display device of claim 10, wherein a portion of the passivation layer is filled in the openings, and the passivation layer has a plurality of grooves corresponding to the openings.

13. The manufacturing method of the display device of claim 12, further comprising:

forming a plurality of isolation materials in the grooves.

14. The manufacturing method of the display device of claim 10, wherein the first conductive layer further comprises a plurality of gates electrically connected to the first signal lines, and the manufacturing method of the display device further comprises forming a plurality of channel layers overlapped with the gates, wherein the second conductive layer further comprises a plurality of sources and a plurality of drains electrically connected to the channel layers, and the sources are electrically connected to the second signal lines.

* * * * *